(12) United States Patent
Wilcox et al.

(10) Patent No.: US 9,252,782 B2
(45) Date of Patent: Feb. 2, 2016

(54) WIRELESS CHIPSET WITH A NON-TEMPERATURE COMPENSATED CRYSTAL REFERENCE

(75) Inventors: Rick A. Wilcox, San Diego, CA (US); Daniel F. Filipovic, San Diego, CA (US); Xu Mike Chi, San Diego, CA (US); Chris M. Rosolowski, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 787 days.

(21) Appl. No.: 13/345,805

(22) Filed: Jan. 9, 2012

(65) Prior Publication Data
US 2012/0209558 A1 Aug. 16, 2012

Related U.S. Application Data (60) Provisional application No. 61/442,513, filed on Feb. 14, 2011.

(51) Int. Cl.
*H03L 1/02* (2006.01)
*H03B 5/30* (2006.01)
*H03B 5/36* (2006.01)

(52) U.S. Cl.
CPC *H03L 1/027* (2013.01); *H03B 5/30* (2013.01); *H03B 5/36* (2013.01)

(58) Field of Classification Search
CPC ..... G01R 31/2896; G06F 1/206; H03L 1/027; H03B 5/36; H03B 5/30
USPC .................................................. 702/130–139
See application file for complete search history.

(56) References Cited

U.S. PATENT DOCUMENTS

| | | | |
|---|---|---|---|
| 4,514,750 A * | 4/1985 | Adams | 257/670 |
| 2003/0058057 A1* | 3/2003 | Schmidt | 331/175 |
| 2003/0184399 A1* | 10/2003 | Lanoue et al. | 331/176 |
| 2007/0104298 A1 | 5/2007 | Filipovic et al. | |
| 2008/0197755 A1 | 8/2008 | Miyahara et al. | |
| 2010/0156545 A1* | 6/2010 | Brodie | 331/66 |
| 2011/0234047 A1 | 9/2011 | Muraki et al. | |
| 2014/0048923 A1* | 2/2014 | Hauenstein | 257/690 |

FOREIGN PATENT DOCUMENTS

| | | |
|---|---|---|
| CN | 101517895 A | 8/2009 |
| EP | 2284988 A1 | 2/2011 |
| JP | 04-069506 * | 3/1992 |

(Continued)

OTHER PUBLICATIONS

International Search Report and Written Opinion—PCT/US2012/025135—ISA/EPO—Jun. 6, 2012.

*Primary Examiner* — Phuong Huynh
(74) *Attorney, Agent, or Firm* — Michelle S. Gallardo (57) ABSTRACT

An apparatus includes a temperature measuring device within a thermally conductive package. A crystal within the package is thermally coupled to the temperature measuring device and subjected to a same temperature as the temperature measuring device. A controller external to the package is configured to receive a signal from the crystal and a temperature measurement from the temperature measuring device. The controller is configured to estimate a frequency error of the crystal based on the temperature measurement and to provide a frequency error estimate to an external system.

23 Claims, 8 Drawing Sheets

(56) References Cited

FOREIGN PATENT DOCUMENTS

| JP | 4096506 | A | 3/1992 |
|---|---|---|---|
| JP | 4096506 | B2 | 6/2008 |
| JP | 2008205938 | A | 9/2008 |
| JP | 2008219123 | A | 9/2008 |
| JP | 2009303198 | A | 12/2009 |
| KR | 100861087 | B1 | 12/2007 |
| WO | 2008033243 | A2 | 3/2008 |

* cited by examiner

FIG. 8

WIRELESS CHIPSET WITH A NON-TEMPERATURE COMPENSATED CRYSTAL REFERENCE

CROSS REFERENCE TO RELATED APPLICATION

The present application claims the benefit of U.S. provisional patent application No. 61/442,513 in the names of WILCOX et al. filed on Feb. 14, 2011.

TECHNICAL FIELD

The present description is related, generally, to electronics, more specifically, to a wireless device for wireless communication

BACKGROUND

In a wireless communication system, a wireless device (e.g., a cellular phone) may transmit data to and receive data from a base station for bi-directional communication. For data transmission, the wireless device modulates outgoing data onto a radio frequency (RF) carrier signal and generates an RF modulated signal that is more suitable for transmission via a wireless channel. The wireless device then transmits the RF modulated signal via a reverse link (or uplink) to the base station. For data reception, the wireless device receives an RF modulated signal transmitted via a forward link (or downlink) by the base station. The wireless device then conditions and digitizes the received signal to obtain samples and further processes the samples to recover the incoming data sent by the base station.

The wireless device utilizes various local oscillator (LO) signals for frequency upconversion and downconversion and various clock signals for digital signal processing. The LO signals and clock signals may need to be at precise frequencies in order to achieve good performance. To obtain the required frequency precision, a temperature compensated crystal oscillator (TCXO) or a voltage controlled TCXO (VCTCXO) is often used to generate a reference signal having a frequency that is compensated over a specified temperature range. The compensation is based on a small number of discrete temperature values and is thus not very accurate when those exact temperatures are not occurring. This reference signal is then used to generate the LO signals and clock signals, which would then have the frequency precision of the reference signal. However, the use of a TCXO or VCTCXO or a heating element increases design complexity as well as cost for the wireless device. Moreover, such solutions lack the resolution needed for accuracy over a wide range of temperatures. In addition, the frequency error is not provided to the overall system, but rather the compensated signal is provided to the system. Accordingly, the system cannot act based on the frequency error.

SUMMARY

According to some aspects of the disclosure, an apparatus includes a temperature measuring device within a package. One or more portions of the package are thermally conductive. The temperature measuring device measures a temperature of the package. The apparatus also includes a crystal within the package. The crystal is thermally coupled to the temperature measuring device and subjected to substantially the same temperature. The apparatus also includes a controller external to the package. The controller is configured to receive a signal from the crystal and a temperature measurement from the temperature measuring device. The controller is also configured to estimate a frequency error of the crystal based on the temperature measurement and to provide a frequency error estimate to an external system.

According to some aspects of the disclosure, a method includes receiving at a controller external to a package, a signal from a crystal housed within the package. The controller also receives temperature measurements from a temperature meeasuring device housed within the package. The crystal is thermally coupled to the temperature measuring device. The method also includes estimating a frequency error of the crystal based on the temperature measurement. The method further includes providing the frequency error estimate to an external system.

According to some aspects of the disclosure, an apparatus includes means for measuring temperature within a package. One or more portions of the package are thermally conductive. The temperature measuring means measures a temperature of the package. The apparatus also includes a crystal within the package. The crystal is thermally coupled to the temperature measuring means and subjected to substantially the same temperature. The apparatus also includes means for controlling an operation of the apparatus. The controlling means is external to the package. The controlling means includes means for receiving a signal from the crystal and a temperature measurement from the temperature measuring means. The controlling means also includes means for estimating a frequency error of the crystal based on the temperature measurement and means for providing a frequency error estimate to an external system.

In another aspect, a computer program product for operating a non-temperature compensated crystal reference includes a computer-readable medium having non-transitory program code recorded thereon. The program code includes program code to receive at a controller external to a package, a signal from a crystal housed within the package, and temperature measurements from a temperature measuring device housed within the package. The crystal is thermally coupled to the temperature measuring device. The program code also includes program code to estimate a frequency error of the crystal based on the temperature measurement. The program code further includes program code to provide the frequency error estimate to an external system.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present teachings, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

The word "exemplary" is used herein to mean "serving as an example, instance, or illustration." Any aspect or design described herein as "exemplary" is not necessarily to be construed as preferred or advantageous over other aspects or designs.

The wireless device described herein may be any electronics device used for communication, computing, networking, and other applications. For example, the wireless device may be a cellular phone, a personal digital assistant (PDA), a wireless modem card, an access point, or some other device used for wireless communication. The wireless device may also be called a mobile station, a user equipment, a terminal, a subscriber unit, a station, or some other terminology.

The wireless device described, herein may be used for various wireless communication systems such as a code division multiple access (CDMA) system, a time division multiple access (TDMA) system, a frequency division multiple access (FDMA) system, an orthogonal frequency division multiple access (OFDMA) system, an orthogonal frequency division multiplexing (OFDM) system, a single-carrier frequency division multiple access (SC-FDMA) system, and other systems that transmit modulated data. A CDMA system may implement one or more radio access technologies such as cdma2000, Wideband-CDMA (W-CDMA), and so on. cdma2000 covers IS-95, IS-2000, and IS-856 standards. A TDMA system may implement Global System for Mobile Communications (GSM). GSM and W-CDMA are described in documents from a consortium named "3rd Generation Partnership Project" (3GPP). cdma2000 is described in documents from a consortium named "3rd Generation Partnership Project 2" (3GPP2). 3GPP and 3GPP2 documents are publicly available. An OFDMA system utilizes OFDM. An OFDM-based system transmits modulation symbols in the frequency domain whereas an SC-FDMA system transmits modulation symbols in the time domain. For clarity, much of the description below is for a wireless device (e.g., cellular phone) in a CDMA system, which may implement cdma2000 or W-CDMA. The wireless device may also be able to receive and process GPS signals from GPS satellites.

In addition, an OFDMA system may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDMA, etc, UTRA and E-UTRA are part of Universal Mobile Telecommunication System (UMTS). 3GPP Long Term Evolution (LTE) and LTE-Advanced (LTE-A) are new releases of UMTS that use E-UTRA. UTRA, E-UTRA, UMTS, LTE, LTE-A and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the wireless networks and radio technologies mentioned above as well as other wireless networks and radio technologies.

Figure 1:
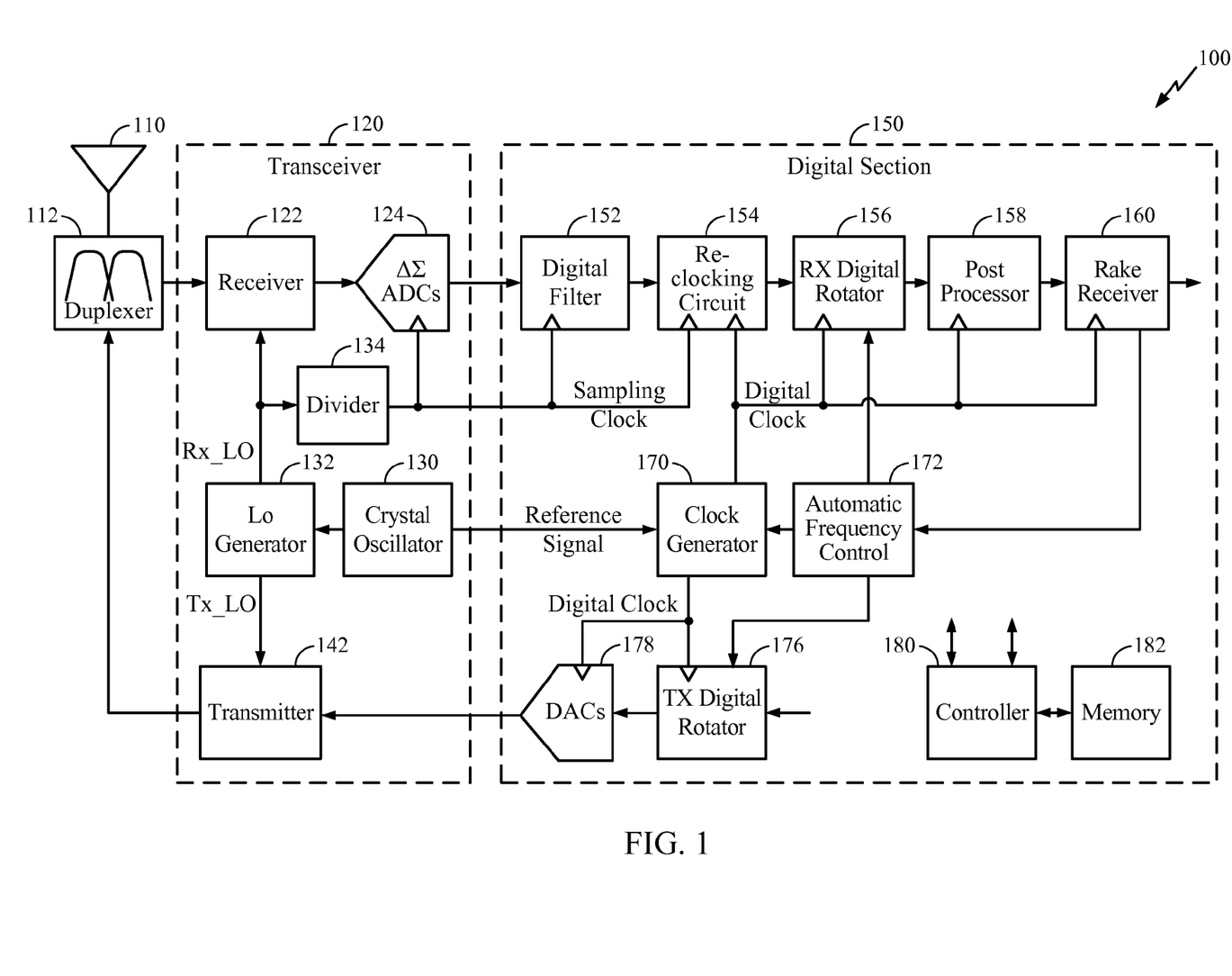
FIG. 1 illustrates an example of a wireless device according to an aspect of the disclosure.

FIG. 1 shows a block diagram of an aspect of a wireless device 100 for a CDMA system. On the receive path, an antenna 110 receives one or more RF modulated signals from one or more base stations and provides a received RF signal to a duplexer 112. The duplexer 112 filters the received RF signal for a desired forward link frequency band and provides an input RF signal to a receiver 122 within a transceiver 120. The desired frequency band may be cellular band from 824 to 894 MHz, PCS band from 1850 to 1990 MHz, DCS band from 1710 to 1880 MHz, IMT-2000 band from 1920 to 2170 MHz, or some other frequency band.

The receiver 122 amplifies and filters the input RF signal. The receiver 122 may also implement a direct-to-baseband architecture or a super-heterodyne architecture. In the super-heterodyne architecture, the input RF signal is frequency down converted in multiple stages, e.g., from RF to an intermediate frequency (IF) in one stage, and then from IF to baseband in another stage. In the direct-to-baseband architecture, the input RF signal is frequency downconverted from RF directly to baseband in one stage. The following description assumes the receiver 122 implements the direct-to-baseband architecture. In this case, the receiver 122 frequency down-converts the input RF signal to baseband with a receive local oscillator (Rx_LO) signal. The frequency of the Rx_LO signal is selected such that the signal in a desired CDMA channel is frequency downconverted to baseband. The receiver 122 provides an analog baseband signal containing the desired signal centered at or near DC.

Analog-to-digital converters (ADCs) 124 digitize the analog baseband signal based on a sampling clock and provide ADC samples to a digital filter 152 within a digital section 150. ADCs 124 may be delta-sigma ADCs (.DELTA.. SIGMA. ADCs) as shown in FIG. 1, flash ADCs, or some other types of ADCs. A .DELTA..SIGMA. ADC can digitize an input signal with few bits of resolution but at a sampling rate that is many times higher than the bandwidth of the signal. As a specific example, .DELTA..SIGMA. ADCs 124 may digitize the analog baseband signal with four bits of resolution at approximately 32 times chip rate (or chip.times.32). The chip rate is 1.2288 megachips/second (Mcps) for cdma2000 and 3.84 Mcps for W-CDMA. These ADC samples may be subsequently processed to obtain output samples with 18 bits of resolution at the chip rate (or chip.times.1).

The digital filter 152 filters the ADC samples based on the sampling clock and provides filtered samples. The digital filter 152 may be a finite impulse response (FIR) filter, an infinite impulse response (IIR) filter, or some other type of filter. The digital filter 152 may also perform DC offset removal and/or other functions. A re-clocking circuit 154 receives and re-clocks or re-samples the filtered samples based on a digital clock and provides data samples.

A receive (RX) digital rotator 156 frequency translates the data samples to correct for frequency error in the downconversion process and provides frequency-translated samples. A post-processor 158 may perform automatic gain control (AGC), digital filtering, sample rate conversion, and/or other processing on the frequency-translated samples and provides output samples. A rake receiver 160 performs demodulation on the output samples for one or more signal paths (or multiparas) and provides symbol estimates. A decoder (not shown in FIG. 1) may deinterleave and decode the symbol estimates and provide decoded data.

On the transmit path, one or more processing units (not shown in FIG. 1) process data to be transmitted and provide data chips. A transmit (TX) digital rotator 176 frequency translates the data chips to compensate for frequency error in the upconversion process and provides output chips. Digital-to-analog converters (DACs) 178 convert the output chips to analog and provide an analog output signal to a transmitter 142 within the transceiver 120. The transmitter 142 amplifies and filters the analog output signal. The transmitter 142 also frequency upconverts the analog output signal to RF with a transmit LO (Tx_LO) signal and provides an output RF signal. The frequency of the Tx_LO signal is selected such that the analog output signal is frequency upconverted to a desired CDMA channel. The duplexer 112 filters the output RF signal for a reverse link frequency band and provides a filtered output RF signal for transmission via antenna 110.

Although not shown in FIG. 1 for simplicity, many signals within the transceiver 120 and digital section 150 are complex signals having inphase (I) and quadrature (Q) components. Each processing unit may process the I and Q components either separately or jointly depending on the type of processing being performed.

A crystal oscillator (XO) 130 generates a reference signal having a predetermined frequency of $f_{ref}$ and good phase noise characteristics. As a specific example, the crystal oscillator 130 may generate a 19.2 MHz reference signal. The crystal oscillator 130 is not compensated for temperature. Hence, the reference frequency $f_{ref}$ drifts with temperature and has a temperature dependent frequency error. An LO generator 132 receives the reference signal and generates the Rx_LO and Tx_LO signals for the receiver 122 and transmitter 142, respectively. The LO generator 132 may include (1) a set of voltage controlled oscillator (VCO) and phase locked loop (PLL) that generates the Rx_LO signal for the receive path and (2) another set of VCO and PLL that generates the Tx_LO signal for the transmit path. The VCO for each path generates a VCO signal having a frequency that may be varied by a control voltage. The PLL for each path generates the control voltage such that the VCO for that path is locked to the reference frequency. The Rx_LO or Tx_LO signal is then generated based on the VCO signal. Alternatively, the LO generator 132 may include a single set of VCO and PLL and mixing circuits that generate the Rx_LO and Tx_LO signals. In any case, the frequency of the Rx_LO signal is determined by the CDMA channel being received, and the frequency of the Tx_LO signal is determined by the CDMA channel to transmit on.

A divider 134 receives the Rx_LO signal and generates the sampling clock. As a specific example, the Rx_LO signal may be at twice the cellular band, and the divider 134 may divide the Rx_LO signal by a fixed integer divider ratio of either 44 or 45 to generate the sampling clock at approximately 40 MHz. Since the frequency of the Rx_LO signal varies depending on the CDMA channel being received, the sampling clock frequency also varies with the received CDMA channel. However, the sampling clock has good phase noise characteristics because of the fixed integer divider ratio.

A clock generator 170 receives the reference signal and generates the digital clock. In an aspect, the clock generator 170 includes a VCO/PLL and a multi-modulus divider. The VCO/PLL generates an oscillator signal having a frequency that is some fixed integer multiple of the reference frequency. The multi-modulus divider generates the digital clock based on the oscillator signal. As a specific example, the VCO/PLL may generate a 384 MHz oscillator signal that is 20 times higher in frequency than the 19.2 MHz reference signal from the crystal oscillator 130. The multi-modulus divider may generate a chip.times.32 clock based on the 384 MHz signal. The chip.times.32 clock is 39.3216 MHz for cdma2000 and may be generated by dividing the 384 MHz signal by a non-integer divider ratio of 9.765625. The multi-modulus divider may also generate other clocks (e.g., a chip.times.16 clock) for other processing units within the digital section 150. In another aspect, the clock generator 170 includes (1) a VCO running at an integer multiple of the chip.times.32 clock and (2) a PLL having a multi-modulus divider that divides the oscillator signal by a non-integer divider ratio to obtain a feedback signal at the reference frequency. In any case, the digital clock has a relatively accurate frequency that may be adjusted by changing the non-integer divider ratio. However, the digital clock has undesired spectral components (or spurs) generated by the non-integer divider ratio.

An automatic frequency control (AFC) unit 172 receives samples from the rake receiver 160, estimates the frequency error based on these samples, and provides a frequency error estimate to digital rotators 156 and 176 and the clock generator 170. The clock generator 170 adjusts its operation based on the frequency error estimate such that the digital clock tracks chip timing.

A controller 180 controls the operation of various units within the wireless device 100. A memory 182 stores data and program codes for the wireless device 100.

FIG. 1 shows a specific aspect of the wireless device 100. In general, the processing for data transmission and reception may be performed in various manners with various processing units. The transceiver 120 and digital section 150 may include different and/or additional processing blocks not shown in FIG. 1. Furthermore, the processing blocks may be arranged in other manners. For example, the digital filter 152 may be positioned after the re-clocking circuit 154 or after the digital rotator 156.

Although not shown in FIG. 1 for simplicity, wireless device 100 may include another receive path to process position location signals, such as global positioning system (GPS) signals. The GPS receive path may include all or many of the processing blocks in the CDMA receive path. However, the processing blocks for the GPS receive path may be designed specifically for GPS and may operate at frequencies that are specific for GPS. For example, the receive LO signal would be at a GPS frequency, the ADC may sample at a different rate, the digital filter may have a different bandwidth, and so on.

The wireless device 100 can provide good performance using a crystal oscillator that is not compensated for temperature, or simply, a non-compensated crystal oscillator. The wireless device 100 has the following features:

Use of a "clean" sampling clock to digitize the baseband signal by the ADCs;

Use of a digital clock with sufficient chip timing accuracy for digital processing;

Use of a re-clocking circuit to go between the sampling clock and the digital clock;

Use of a digital rotator on the receive path to correct for frequency error in the frequency downeonversion process;

Use of a digital rotator on the transmit path to compensate for frequency error in the frequency upconversion process;

Estimation of the frequency error of the crystal oscillator, which is temperature dependent since the crystal oscillator is uncompensated for temperature; and Adjustment of the digital clock and the digital rotators in the receive and transmit paths based on the frequency error estimate.

These various features are described in detail below. The digital clock has spurs that can degrade performance if used for sampling by .DELTA..SIGMA. ADCs 124. These spurs are generated by dividing an oscillator signal by a non-integer divider ratio that can vary over temperature due to frequency drift in crystal oscillator 130. This potential degradation is avoided by using a sampling clock having good phase noise characteristics for .DELTA..SIGMA. ADCs 124. This sampling clock is generated by dividing the Rx_LO signal by a fixed integer divider ratio that does not change regardless of (1) the CDMA channel being received and (2) the frequency drift in crystal oscillator 130. This results in the sampling clock not being synchronized with the digital clock. The re-clocking circuit 154 performs re-clocking of the samples so that (1) ADCs 124 and digital filter 152 can operate based on the sampling clock and (2) the digital rotator 156, post processor 158, rake receiver 160 and subsequent processing units can operate based on the digital clock.

Figure 2:
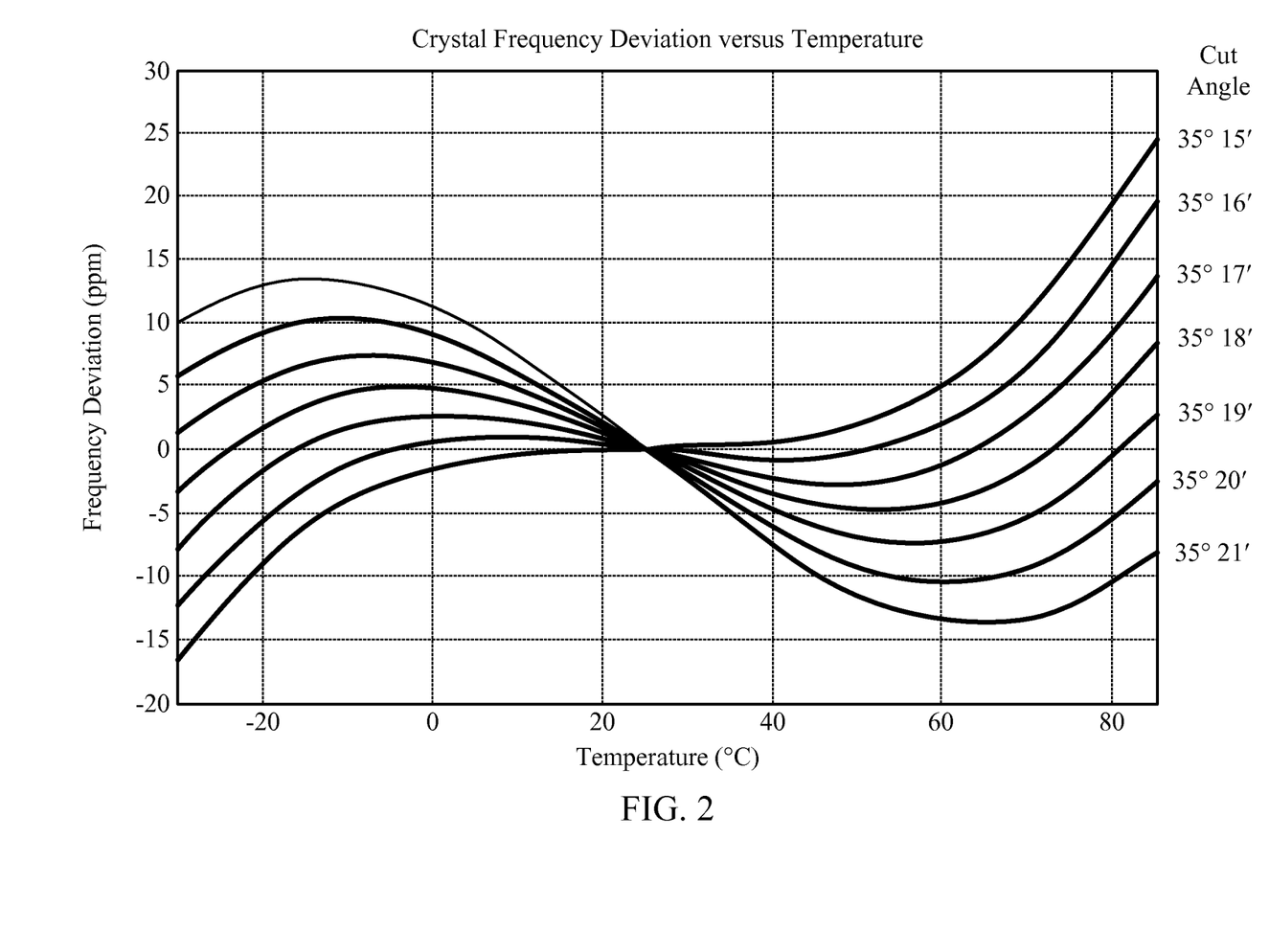
FIG. 2 shows a graph illustrating frequency deviation versus temperature for an AT-cut crystal.

FIG. 2 shows plots of frequency deviation versus temperature for an exemplary AT-cut crystal. Different types of crystal cuts are available, and a popular cut for good frequency stability is the AT-cut. A crystal is cut such that it resonates at a desired nominal frequency (e.g., 19.2 MHz) at room temperature (e.g., 23 degree Celsius). The resonant frequency of the crystal varies across temperature based on a curve that is dependent on the angle of the crystal cut. FIG. 2 shows the curves for seven different cut angles for an AT-cut crystal. Each curve shows the deviation from the nominal frequency, in parts per million (ppm), across temperature for a specific cut angle.

The Crystal oscillator 130 may be designed such that its oscillation frequency falls within a specified range. This covers the initial frequency error for the crystal and frequency drift over temperature. For example, the specified range may be +−20 ppm to cover a crystal frequency error of +−10 ppm and a temperature drift of +−10 ppm. In this case, the reference signal from crystal oscillator 130 may be off by as much as +−20 ppm from the nominal frequency.

For the aspect shown in FIG. 1, the reference signal from crystal oscillator 130 is used to generate (1) the Rx_LO signal used for frequency downconversion, (2) the Tx_LO signal used for frequency upconversion, and (3) the oscillator signal used to generate the digital clock. The frequencies of the Rx_LO, Tx_LO, and oscillator signals are related to the reference frequency by some fixed ratios. Hence, an error of X ppm in the reference frequency results in an error of X ppm in the Rx_LO, Tx_LO, and oscillator frequencies. The frequency errors in the Rx_LO, Tx_LO, and oscillator signals may be handled as described below.

Figure 3:
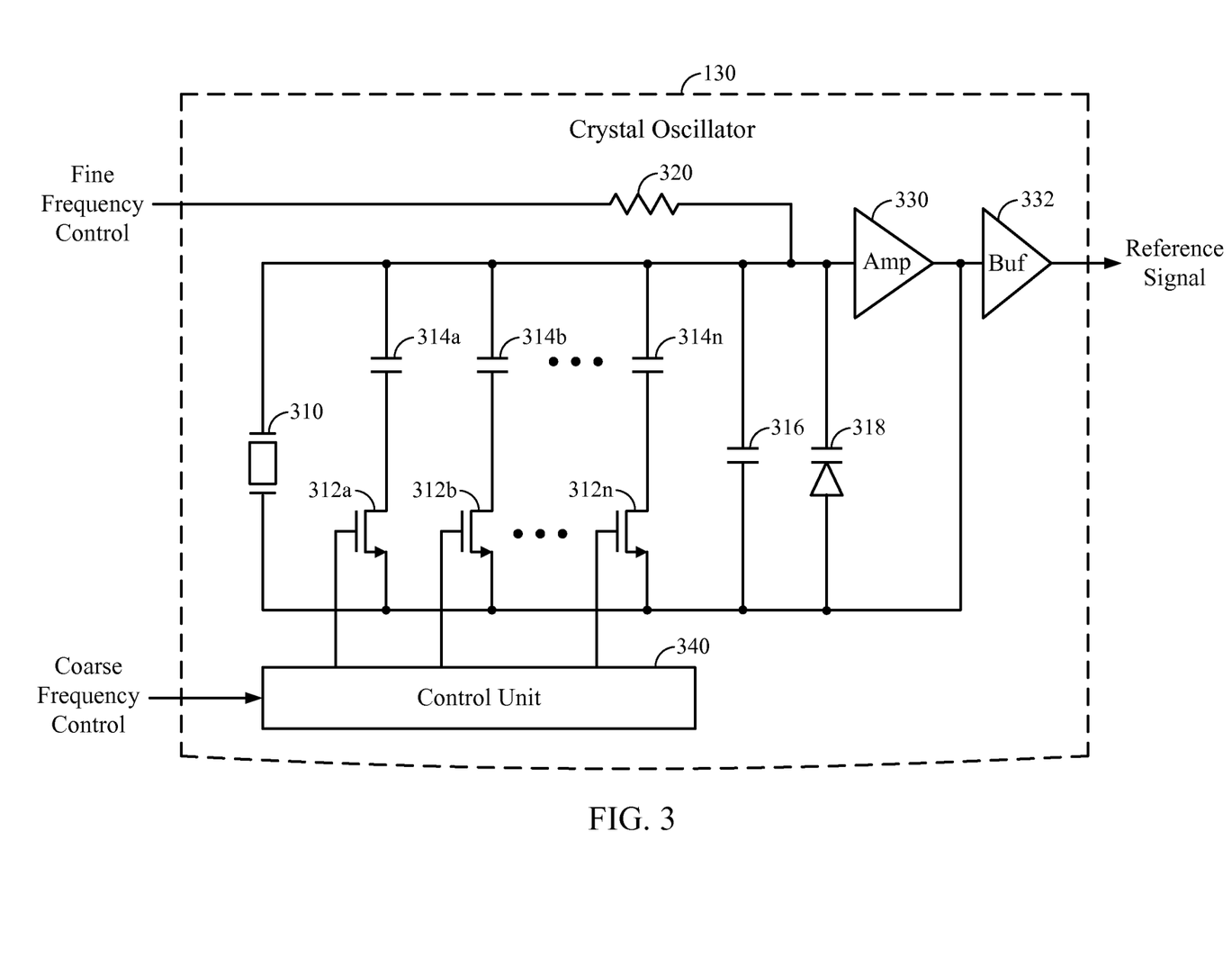
FIG. 3 illustrates a schematic diagram of a crystal oscillator.

FIG. 3 shows a schematic diagram of an aspect of the crystal oscillator 130. For this aspect, the crystal oscillator 130 includes (1) a coarse tune control circuit that may be used for coarse frequency adjustment and (2) a fine tune control circuit that may be used for fine frequency adjustment.

Within the crystal oscillator 130, a crystal 310, a capacitor 316, and a variable capacitor (varactor) 318 couple in parallel and between the input and output of an amplifier (Amp) 330. N-channel field effect transistors (N-FETs) 312a through 312n have their sources coupled, to the output of amplifier 330, their gates coupled to a control unit 340, and their drains coupled to one end of each of capacitors 314a through 314n, respectively. The other end of each of capacitors 314a through 314n couples to the input of the amplifier 330. The control unit 340 receives a coarse frequency control signal and generates the control signals for N-FETs 312a through 312n. A resistor 320 has one end coupled to the input of the amplifier 330 and the other end receiving a fine frequency control signal. A buffer (Buf) 332 has its input coupled to the output of amplifier 330 and its output providing the reference signal.

The amplifier 330 provides the signal amplification for oscillation. Crystal 310, capacitors 314a through 314n and 316, and varactor 318 form a resonant circuit that determines the frequency of oscillation. N-FETs 312a through 312n act as switches that connect or disconnect the corresponding capacitors 314a through 314n from the resonant circuit. The buffer 332 provides buffering and signal drive for the reference signal.

The coarse tune control circuit includes N-FETs 312a through 312n, capacitors 314a through 314n, and control unit 340. Capacitors 314a through 314n may have different capacitances that can vary the oscillation frequency by different amounts when connected. Capacitors 314a through 314n may be selectively connected or disconnected based on the coarse frequency control signal. For example, a 3-bit coarse tune control circuit may be used to adjust the oscillation frequency by approximately 5 ppm for each least significant bit (LSB) of control. The fine tune control circuit includes the varactor 318 and resistor 320. The varactor 318 has a capacitance that can be adjusted based on the voltage of the fine frequency control signal. For example, the fine tune control circuit may provide a tuning range of +−10 ppm. The coarse and/or tune control circuits may be used to adjust the oscillation frequency to account for known variations and/or for other purposes. The coarse and/or tune control circuits may also be omitted from the crystal oscillator 130.

Figure 4:
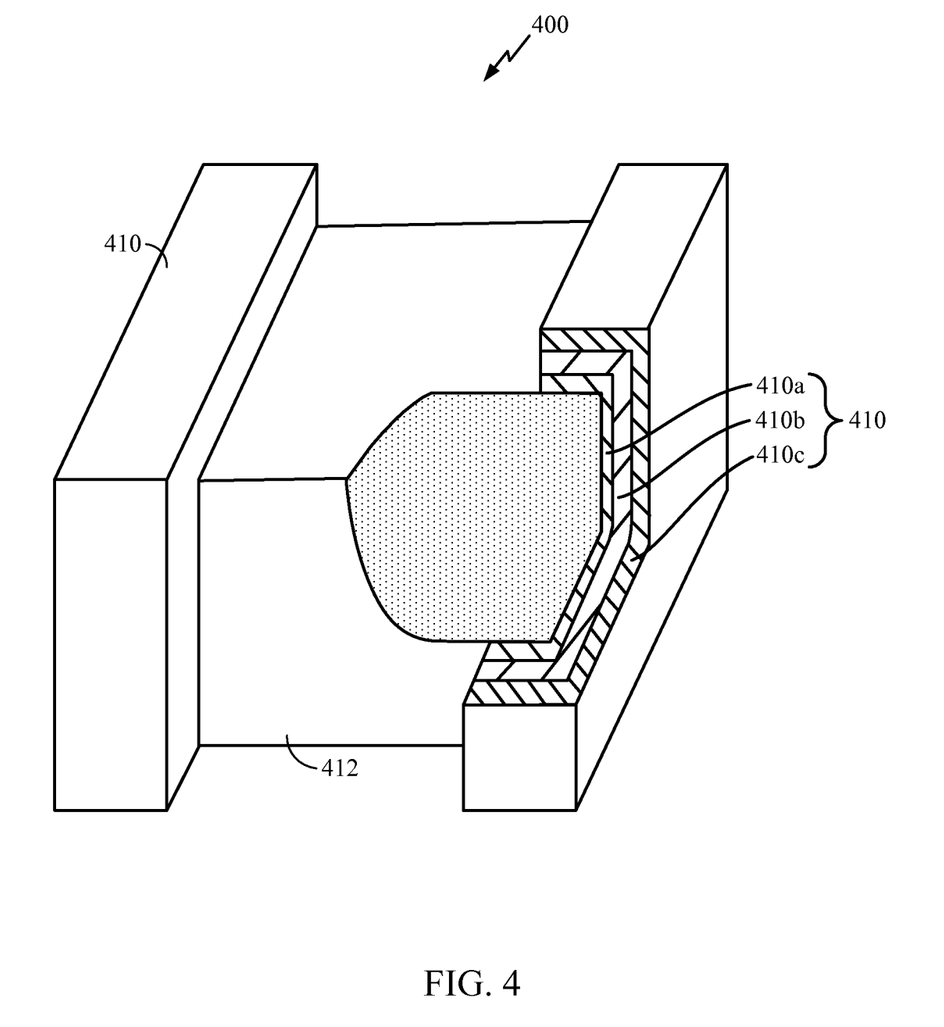
FIG. 4 illustrates a schematic diagram of an aspect of a temperature measuring device.

FIG. 4 shows a schematic diagram of an aspect of a temperature measuring device 400. In some aspects of the disclosure, the temperature measuring device 400 can be a thermistor, for example, a thermistor chip. As shown in FIG. 4, a conventional thermistor chip 400 of this kind usually has terminal electrodes 410 provided at both end parts of a thermistor block 412 having, for example, an oxide of a transition metal such as Mn, Co and Ni as its principal component. The terminal electrodes 410 may comprise an end electrode 410a formed by applying Ag/Pd or the like in a paste form, for example, and then firing. In some aspects of the disclosure, the terminal electrode may also include a plating layer 410b formed on its surface by using Ni or Sn, for example. The terminal electrode may also include a middle layer, such as a Nickel-Copper layer. The normal-temperature resistance value of such a thermistor chip is generally determined by the resistor value of the thermistor element 412 and the position of the terminal electrodes 410.

Descriptions of the temperature measuring device are intended to be interpreted broadly and are not limited to the exemplary thermistor 400. Many of the features of the aspects of the thermistor described above may be combined, whenever appropriate.

Figure 5:
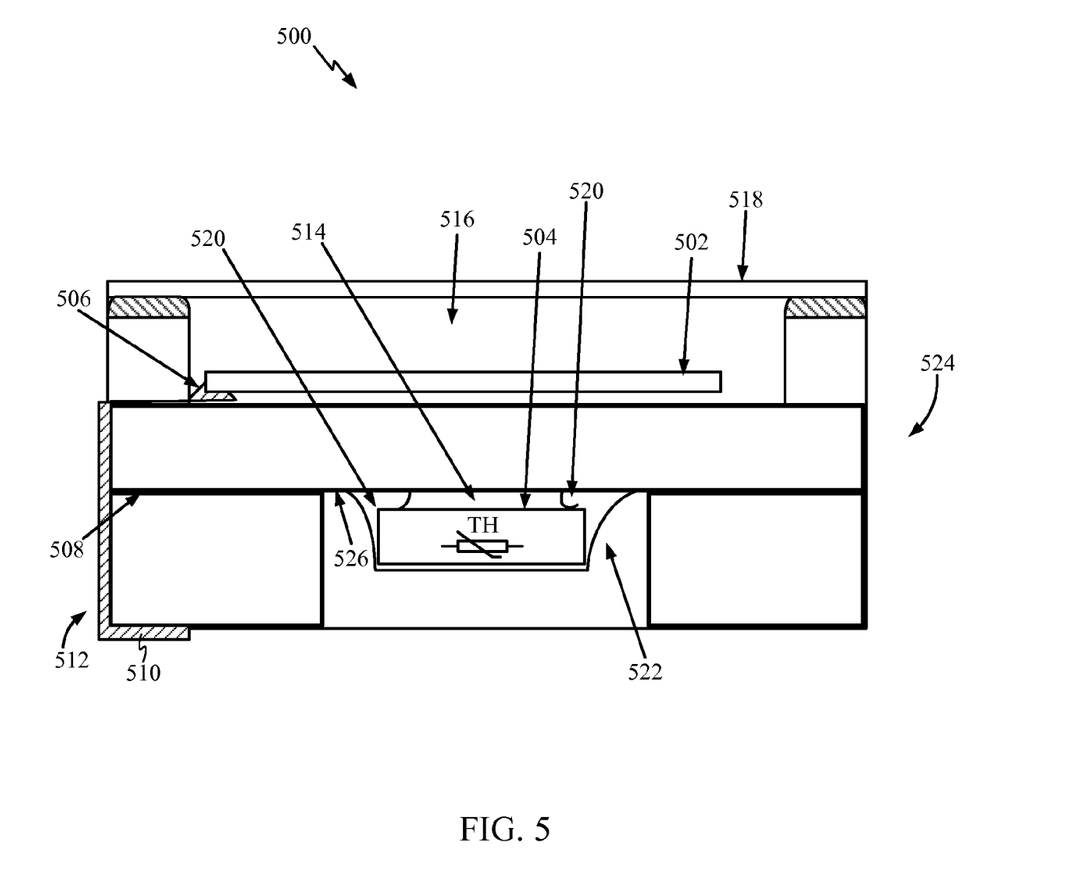
FIG. 5 illustrates a thermally conductive package configured to accommodate a crystal device and a temperature measuring device according to an aspect of the disclosure.

FIG. 5 illustrates a package configured to accommodate a crystal device or crystal, e.g., discrete quartz crystal, and a temperature measuring device, e.g., a thermistor. The package 500 includes a case 524 for accommodating a crystal 502 and the temperature measuring device 504 and output electrodes 510 provided on an undersurface of the case 524. In some aspects of the disclosure, the entire package 500 or at least some portions of the package 500 is thermally conductive. The case 524 includes a first chamber or cavity 516 configured to accommodate the crystal 502 and a second chamber or cavity 514 configured to accommodate the temperature measuring device 504. The second chamber 514 can include a bottom wall 526.

The crystal 502 may be a discrete quartz crystal for generating a reference frequency for a computer system or chipset. In some aspects of the disclosure, the crystal 502 may be used in conjunction with a circuit external to the thermally conductive package 500 to implement a crystal oscillator, e.g., the crystal oscillator 130 illustrated in FIG. 3. The temperature measuring device 504 can be a discrete thermistor 400 illustrated in FIG. 4. In some aspects of the disclosure, the package 500 can be a ceramic package, where the ceramic package can be a dual C or H configuration. The package 500 can be made of any material that has low thermal resistance allowing for an accurate measurement of the crystal temperature. In some aspects of the disclosure, a package construction includes a base layer (not shown). The base layer may be thermally isolated from a circuit card assembly such that the temperature measuring device 504 and the crystal 502 are thermally coupled via a ceramic or other thermally conductive material. In some aspects of the disclosure, the crystal 502 can be placed in an upper chamber (upper C) and the temperature measuring device 504 can be placed in a lower chamber (lower C) of the ceramic package. The ceramic material is configured to be mechanically robust to mechanically isolate the crystal 502 from the movement on an electronic board or printed circuit board. A high thermal conductivity ceramic material may be selected to increase/maximize the thermal coupling between the temperature measuring device 504 and the crystal 502. The location of the temperature measuring device 504 may be selected to increase the correlation between the temperature of the crystal 502 and the temperature measuring device 504.

The temperature measuring device 504 and the crystal 502 are thermally coupled to each other and to the case 524 with a material having low thermal resistance. The crystal 502 may be coupled through a conductive substrate 506 to an inner electrode 508 and supported in a cantilever state. The inner electrode 508 may be linked to the outer electrode 510 through a conductive line 512 wired on the thermally conductive package 500. The temperature measuring device 504 may be connected through a conductive substrate 520 to an inner electrode 522, for example. The inner electrode 522 may be linked to an outer electrode 510 on the thermally conductive package 500. A cover 518 that may be configured to hermetically seal the thermally conductive package 500 may enclose an opening to the crystal 502.

In some aspects of the disclosure, the first chamber 516 can be the upper chamber and the second chamber 514 can be the lower chamber. The crystal 502 and the temperature measuring device 504 can be accommodated in either the upper chamber or the lower chamber. In some aspects, the first chamber 516 and the second chamber 514 are adjacent to each other. In some aspects, the crystal 502 and the temperature measuring device 504 can be accommodated in the same chamber.

Figure 6:
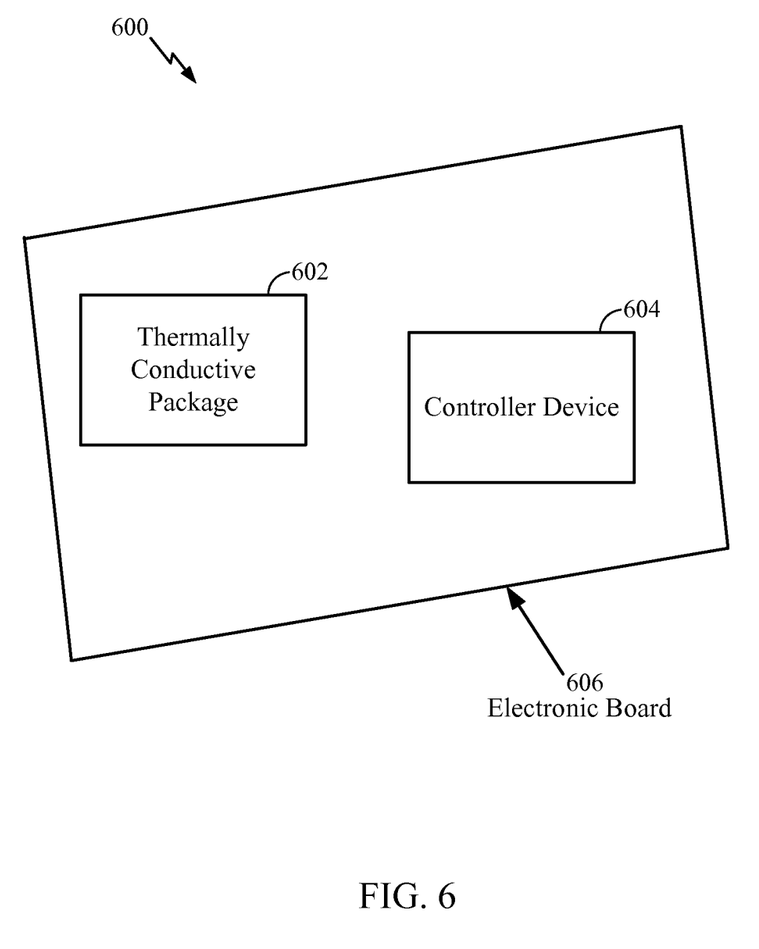
FIG. 6 illustrates a temperature compensation system according to an aspect of the disclosure.

FIG. 6 illustrates a temperature compensation system according to an aspect of the disclosure. For explanatory purposes, FIG. 6 will be discussed with reference to the above-discussed FIG. 5. The system 600 includes a thermally conductive package 602, similar to the thermally conductive package 500 of FIG. 5 and a controller 604, e.g., the controller 180 or any other controller or processor. The thermally conductive package 602 can be a surface mounted package that is adapted to be mounted on a surface of an electronic board or printed circuit board 606. The controller 604 may also be configured for mounting on the electronic board or printed circuit board 606.

A temperature measuring device, for example the temperature measuring device 504 of FIG. 5, in the thermally conductive package 602, can be configured to measure the temperature of its surroundings and to transmit a temperature measuring signal, indicating the temperature of its surroundings, to the controller 604. Because the temperature measuring device 504 is co-located in the same thermally conductive package 602 as the crystal device 502, the temperature reading of the temperature measuring device 504 is substantially the same as the temperature of the crystal 502.

In radio systems illustrated above, there is a clock source for a computer system or chipset or the like. The clock source for some aspects may be 19.2 MHz, for example. Where the clock source is a crystal, such as the crystal 502. The crystal 502 generates a reference signal having a predetermined frequency, e.g., 19.2 MHz. The crystal 502 is not compensated for temperature. Hence, the reference frequency drifts with temperature and has a temperature dependent frequency error. In some aspects, the crystal 502 is coupled to an oscillator located on an external chip, e.g., a power management integrated circuit (PMIC). In some aspects, the oscillator may generate the reference signal, for example at 19.2 MHz, rather than the crystal 502.

In some aspects, the controller 604 can be configured to execute software/firmware that compensates for the crystal frequency changes resulting from temperature in accordance with temperature measuring signals generated by the temperature measuring device 504 and received at the controller 604. For example, the controller 604 may be configured to receive temperature measurements from the temperature measuring device and to determine a temperature difference, to ascertain a frequency error difference based on the temperature difference. One or more frequency slopes can be derived from the multiple temperature measurements and multiple frequency slopes can be accumulated to derive a frequency error estimate. In some aspects, the accumulated frequency slopes may be used to obtain a frequency change and to sum the frequency change with an initial frequency value to obtain the frequency error estimate.

In some aspects, the system 600 may include a rotator such as a rotator 156 configured to receive data samples having the frequency error. The rotator 156 may also be configured to frequency translate the data samples based on the frequency error estimate, and to provide frequency-translated samples.

In some aspects, the crystal 502 described herein, may replace a temperature compensated crystal oscillator of the computer system, chipset or the like. The discrete quartz crystal 502, for example, and the temperature measuring device 504, for example, can be used in conjunction with a power management integrated circuit (PMIC) and a radio frequency interface chip (RFIC) or a baseband processor. The circuit external to the thermally conductive package, e.g., the PMIC, can be leveraged for the oscillator functionality. The radio frequency interface chip or baseband processor can be configured to execute software/firmware or a temperature compensation algorithm that compensates for the crystal frequency changes as a function of temperature due to the third order polynomial behavior of the crystal frequency output as a function of temperature. In some aspects, the temperature compensation algorithm can be implemented according to the temperature compensation method described in U.S. Patent Application Publication No. 2007/0104298, the disclosure of which is expressly incorporated by reference herein in its entirety.

Figure 7:
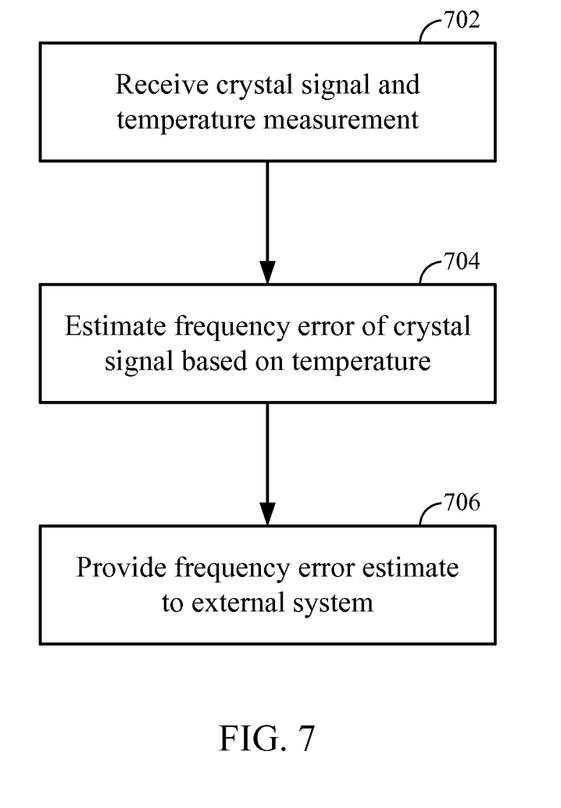
FIG. 7 illustrates a signal processing method using a non-compensated crystal according to an aspect of the disclosure.

FIG. 7 illustrates a signal processing method using a non-compensated crystal according to an aspect of the disclosure. This method may be implemented in the temperature compensation system 600 illustrated in FIG. 6. At block 702, the process starts with receiving at a controller external to a thermally conductive package, a signal from a crystal and temperature measurements from a temperature measuring device. The crystal and the temperature measuring device are both housed within the thermally conductive package and thermally coupled together. One or more portions of the package are thermally conductive. The process then continues to block 704 where the controller estimates a frequency error of the crystal based on the measured temperature. At block 706, the controller provides the frequency error estimate to an external system, such as a power management IC, a radio frequency IC, and/or a baseband processor.

In one configuration, the apparatus includes means for measuring temperature within the package. In one aspect of the disclosure, the temperature measuring means may be the temperature measuring device 400 and/or the temperature measuring device 504 configured to perform the functions recited by the temperature measuring means. In one configuration, the apparatus includes means for means for controlling an operation of the apparatus. In one aspect of the disclosure, the controlling means may be the controller 180 and/or the controller device 804 configured to perform the functions recited by the controlling means.

Figure 8:
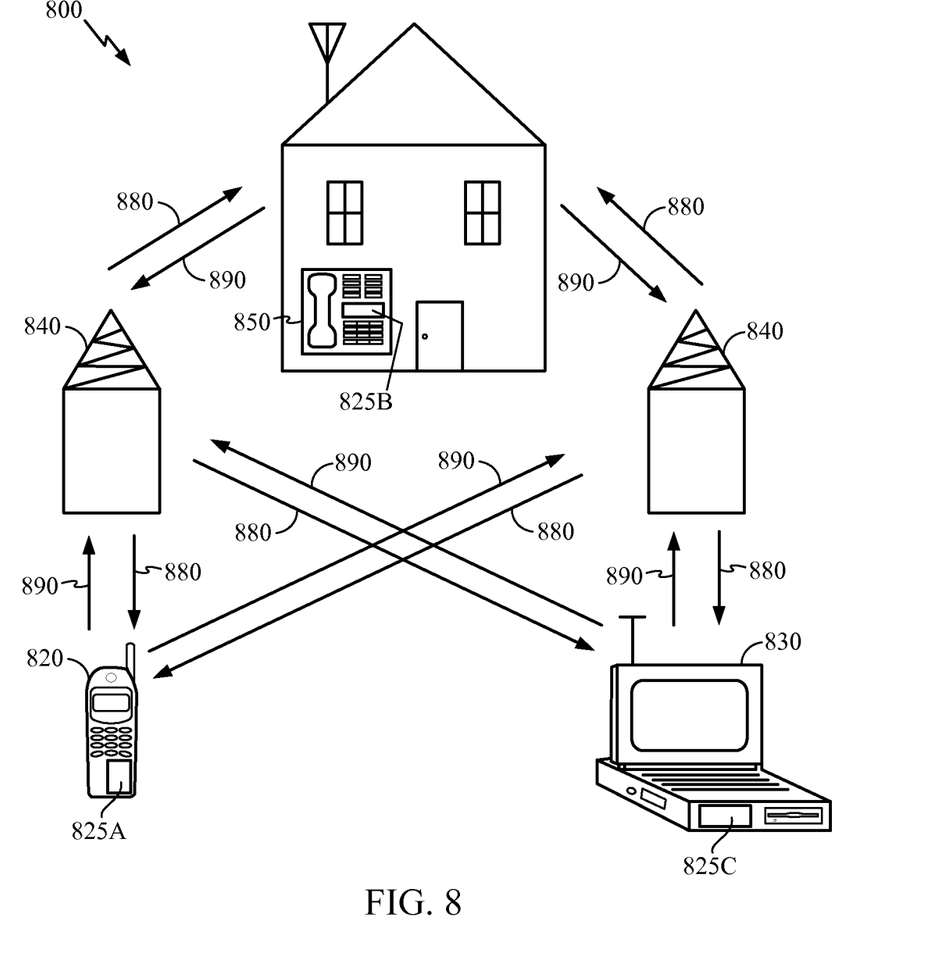
FIG. 8 is a block diagram showing an exemplary wireless communication system in which an aspect of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C and 825B, which include the disclosed integrated temperature measuring device and crystal device. It will be recognized that other devices may also include the disclosed integrated temperature measuring device and crystal device, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 8 illustrates remote units according to the teachings of the disclosure, the disclosure is not limited to these exemplary illustrated units. Aspects of the disclosure may be suitably employed in any device, which includes integrated temperature measuring device and crystal device.

The methodologies described herein may be implemented by various means depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine or computer readable medium tangibly embodying instructions may be used in implementing the methodologies described herein. For example, software code may be stored in a memory and executed by a processor. When executed by the processor, the executing software code generates the operational environment that implements the various methodologies and functionalities of the different aspects of the teachings presented herein. Memory may be implemented within the processor or external to the processor. As used herein, the term "memory" refers to any type of long term, short term, volatile, nonvolatile, or other memory and is not to be limited to any particular type of memory or number of memories, or type of media upon which memory is stored.

The machine or computer readable medium that stores the software code defining the methodologies and functions described herein includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. As used herein, disk and/or disc includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media.

In addition to storage on computer readable medium, instructions and/or data may be provided, as signals on transmission media included in a communication apparatus. For example, a communication apparatus may include a transceiver having signals indicative of instructions and data. The instructions and data are configured to cause one or more processors to implement the functions outlined in the claims.

Although the present teachings and their advantages have been described, in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present teachings. Accordingly, the appended claims are intended to include within their scope such processes, machines, manufacture, compositions of matter, means, methods, or steps.

What is claimed is:

1. An apparatus, comprising:
a temperature measuring device within a package, at least a portion of the package being thermally conductive, the temperature measuring device configured to measure a temperature of the package;
a clock source within the package, the clock source being thermally coupled to the temperature measuring device and subjected to substantially the same temperature as the temperature measuring device; and
a controller external to the package, the controller configured to receive an uncompensated signal from the clock source and a temperature measurement from the temperature measuring device, the controller configured to estimate a frequency error of the clock source based on the uncompensated signal and the temperature measurement and to provide the frequency error estimate to an external system.

2. The apparatus of claim 1, in which the package comprises a ceramic material.

3. The apparatus of claim 1, in which the package and the controller are implemented on an electronic board.

4. The apparatus of claim 1, in which the package is configured to accommodate the clock source in an upper cavity of the package and to accommodate the temperature measuring device in a lower cavity of the package.

5. The apparatus of claim 1, in which the temperature measuring device comprises a thermistor.

6. The apparatus of claim 1, in which the package is configured in an H configuration.

7. The apparatus of claim 1, in which the package comprises a base layer thermally isolated from a circuit card assembly.

8. The apparatus of claim 1, integrated into at least one of a mobile phone, a set top box, a music player, a video player, an entertainment unit, a navigation device, a computer, a hand-held personal communication systems (PCS) unit, a portable data unit, or a fixed location data unit.

9. A method comprising:
receiving at a controller external to a package, an uncompensated signal from a clock source housed within the package, and temperature measurements from a temperature measuring device housed within the package, the clock source being thermally coupled to the temperature measuring device;
estimating a frequency error of the clock source based on the uncompensated signal and the temperature measurement; and
providing the frequency error estimate to an external system.

10. The method of claim 9, further comprising integrating the controller, clock source, and temperature measuring device into at least one of a mobile phone, a set top box, a music player, a video player, an entertainment unit, a navigation device, a computer, a hand-held personal communication systems (PCS) unit, a portable data unit, and a fixed location data unit.

11. An apparatus, comprising:
means for measuring temperature within a package, at least a portion of the package being thermally conductive, the temperature measuring means being configured to measure a temperature of the package;
a clock source within the package, the clock source being thermally coupled to the temperature measuring means and subjected to substantially the same temperature; and
means for controlling an operation of the apparatus, the controlling means being external to the package, the controlling means comprising means for receiving an uncompensated signal from the clock source and a temperature measurement from the temperature measuring means, the controlling means comprising means for estimating a frequency error of the clock source based on the uncompensated signal and the temperature measurement and means for providing the frequency error estimate to an external system.

12. The apparatus of claim 11, in which the package comprises a ceramic material.

13. The apparatus of claim 11, in which the package and the controlling means are implemented on an electronic board.

14. The apparatus of claim 11, in which the package is configured to accommodate the clock source in an upper cavity of the package and to accommodate the temperature measuring means in a lower cavity of the package.

15. The apparatus of claim 11, in which the package comprises a base layer thermally isolated from a circuit card assembly.

16. The apparatus of claim 11, in which the package is configured according to a dual C configuration.

17. The apparatus of claim 11, integrated into at least one of a mobile phone, a set top box, a music player, a video player, an entertainment unit, a navigation device, a computer, a hand-held personal communication systems (PCS) unit, a portable data unit, or a fixed location data unit.

18. A computer program product residing on a non-transitory processor-executable computer-readable medium, the computer program product comprising processor-executable instructions configured to cause a processor to:
receive, at a controller external to a package, an uncompensated signal from a clock source housed within the package and temperature measurements from a temperature measuring device housed within the package, the clock source being thermally coupled to the temperature measuring device;
estimate a frequency error of the clock source based on the uncompensated signal and the temperature measurement; and
provide the frequency error estimate to an external system.

19. The computer program product of claim 18, integrated into at least one of a mobile phone, a set top box, a music player, a video player, an entertainment unit, a navigation device, a computer, a hand-held personal communication systems (PCS) unit, a portable data unit, or a fixed location data unit.

20. The apparatus of claim 1, in which the clock source comprises a crystal.

21. The method of claim 9, in which the clock source comprises a crystal.

22. The apparatus of claim 11, in which the clock source comprises a crystal.

23. The computer program product of claim 18, in which the clock source comprises a crystal.

* * * * *